United States Patent [19]
Rolandi

[11] Patent Number: 6,097,628
[45] Date of Patent: Aug. 1, 2000

[54] MULTI-LEVEL MEMORY CIRCUIT WITH REGULATED WRITING VOLTAGE

[75] Inventor: Paolo Rolandi, Volpedo, Italy

[73] Assignee: STMicroelectronics S.r.l., Agrate Brianza, Italy

[21] Appl. No.: 09/202,656

[22] PCT Filed: Oct. 30, 1996

[86] PCT No.: PCT/IT96/00199

§ 371 Date: Jun. 7, 1999

§ 102(e) Date: Jun. 7, 1999

[87] PCT Pub. No.: WO97/49088

PCT Pub. Date: Dec. 24, 1997

[30] Foreign Application Priority Data

Jun. 20, 1996 [IT] Italy .................................. 96830354

[51] Int. Cl.[7] .................................................. G11C 11/34
[52] U.S. Cl. .............................. 365/185.03; 365/185.18; 365/185.23
[58] Field of Search ...................... 365/185.03, 185.23, 365/185.01, 185.18

[56] References Cited

U.S. PATENT DOCUMENTS

| | | | |
|---|---|---|---|
| 5,333,122 | 7/1994 | Ninomiya | 365/185.11 |
| 5,412,601 | 5/1995 | Sawada et al. | 365/185.03 |
| 5,615,151 | 3/1997 | Furuno et al. | 365/185.18 |
| 5,625,584 | 4/1997 | Uchino et al. | 365/45 |
| 5,751,635 | 5/1998 | Wong et al. | 365/185.19 |
| 5,815,425 | 9/1998 | Wong et al. | 365/45 |

FOREIGN PATENT DOCUMENTS

| | | | |
|---|---|---|---|
| 0 086 360 A2 | 1/1983 | European Pat. Off. | G11C 11/34 |
| 0 394 705 A1 | 3/1990 | European Pat. Off. | G11C 17/00 |
| 0 715 312 A1 | 11/1994 | European Pat. Off. | G11C 11/56 |

*Primary Examiner*—David Nelms
*Assistant Examiner*—Hoai V. Ho
*Attorney, Agent, or Firm*—Theodore E. Galanthay; Allen, Dyer, Doppelt, Milbrath & Gilchrist, P.A.

[57] ABSTRACT

A multi-level memory circuit for binary information includes a plurality of memory cells each adapted to store more than one item of binary information, and each memory cell includes at least one floating gate MOS transistor. The information stored therein corresponds to the level of the cell threshold voltage. A write signal generating circuit is adapted to an input supply voltage and provides a write voltage to the memory cells. The write signal generating circuit generates internally at least one write voltage having a selectable or selected value from a number of discrete regulated values corresponding to the number of the discrete levels provided.

27 Claims, 4 Drawing Sheets

MULTI-LEVEL MEMORY CIRCUIT WITH REGULATED WRITING VOLTAGE

FIELD OF THE INVENTION

This invention relates to a multi-level type of memory circuit for binary information.

Memories of this type are usually termed "non-volatile" because of their capability to retain stored information over very long time periods, even in the absence of a power supply, and include the EPROM, EEPROM, and FLASH EEPROM families.

BACKGROUND OF THE INVENTION

Known own from U.S. Pat. Nos. 5,218,569 and 5,394,362 are multi-level non-volatile memories of this type. The construction of a FLASH EEPROM multi-level memory is also described in an article TA 7.7, "A Multilevel Cell 32Mb Flash Memory", ISSCC95 Conference, Feb. 16, 1995.

These publications also address and solve the problem of programming or writing by a cyclical repetition of program pulses and verification steps; specifically, a cell to be written into is applied, between its gate and source terminals, a voltage write pulse from a row decoding circuit which is power ed by a supply circuit. The cell is then read from to verify the level of its threshold voltage and decide on whether a new pulse is to be applied thereto or the programming brought to an end.

The above article postulates a four-level program and a distribution of the threshold voltages of approximately 500 mV for each level. This involves a spacing of about 500 mV between levels, for a supply voltage of about 3.3 V to the integrated electronic storage device.

If the supply voltage were lower, as is in the wish of so many manufacturers of electronic apparatus for telecommunications applications, for example, such values would have to be reduced, and be reduced still further as the number of the levels increases.

The provision of distributions so narrow and levels so close together requires extended programming times, because the number of the program cycles has to be increased, as well as highly sophisticated and complex read circuits.

This invention is based on the observation that, when a set of non-volatile memory cells having a given distribution of threshold voltages are subjected to the same electrical "treatment", the distribution remains near-constant and shifts in voltage by an amount not determinable with any great accuracy.

This invention proposes, therefore, of arranging for the write operations to be electrically identical for all the cells; this being accomplished by so regulating the write voltage as to make it independent of at least the supply voltage.

To avoid read errors due to shifting inaccuracy, it would be of advantage if the levels could be well spaced apart; this being obtained by generating a high write voltage internally with respect to the supply voltage.

With the levels well spaced apart, the write operation is less critical, and can be carried out advantageously with a single pulse of properly regulated width and duration.

BRIEF DESCRIPTION OF THE DRAWINGS

The invention can be more clearly appreciated from the following description, to be read in conjunction with the accompanying drawings, in which.

DETAILED DESCRIPTION OF THE PREFERRED EMBODIMENTS

Figure 1:
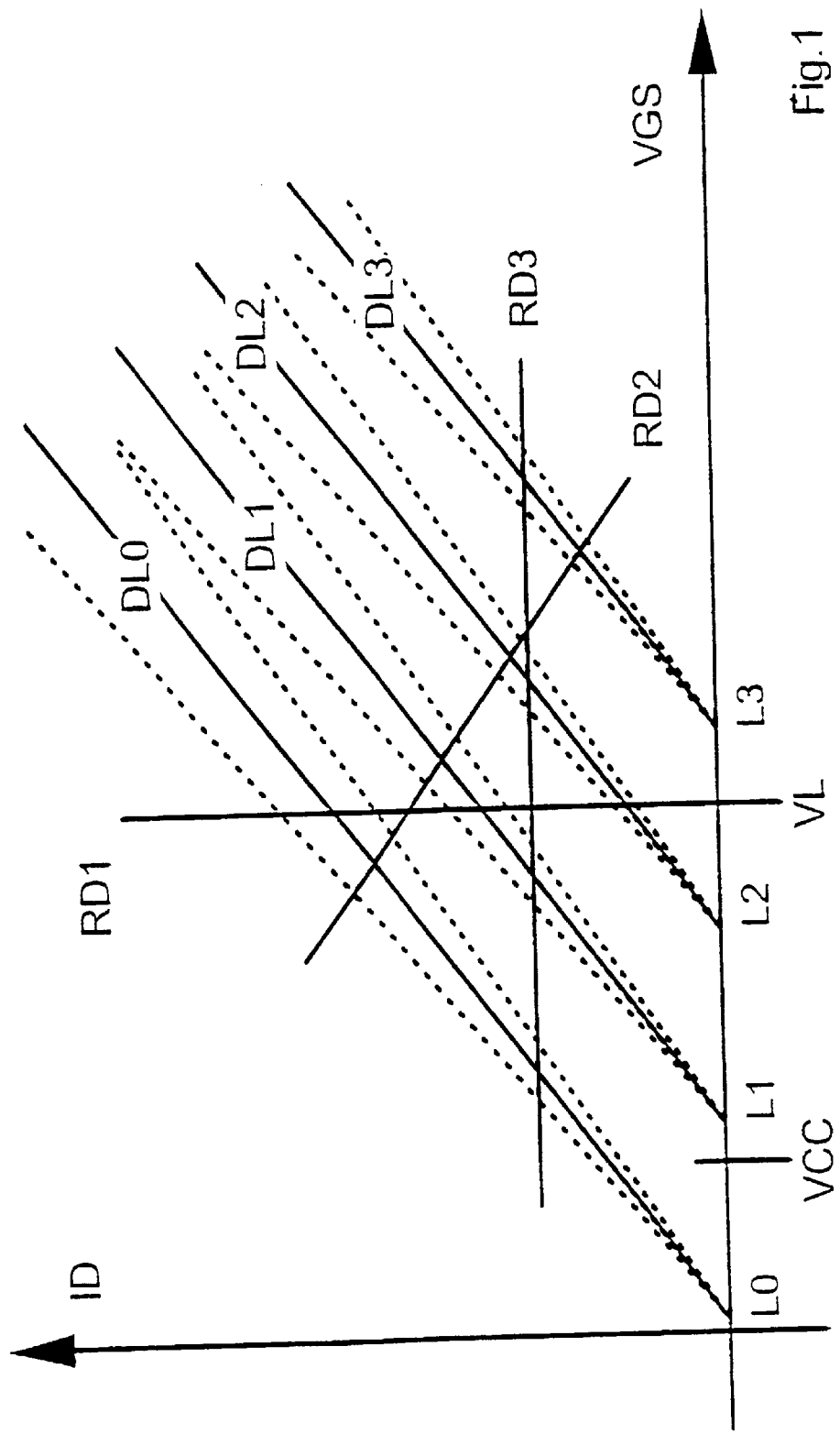
FIG. 1 illustrates cell characteristics vs. associated levels and gain variations.

FIG. 1 depicts an ideal situation in which the cells associated with one level have exactly the same threshold voltage. In the instance of FIG. 1, there are tour discrete levels DL0, DL1, DL2, DL3 provided which are associated with four discrete cell threshold voltage values L0, L1, L2, L3. This can only be obtained by adopting extremely complicated write and erase methods, and such a situation can at best be approached in actual practice.

Irrespective of the method used, the characteristics of the various cells associated with one level are bound to be different because the manufacture of integrated circuits cannot yield perfectly identical cells. Thus, such characteristics will show a distribution, as indicated by dash lines and referenced DL0, DL1, DL2, DL3 in FIG. 1, centered about an average characteristic indicated by a full line in FIG. 1. The parameter that differentiates cells in the same distribution is the so-called "gain" of a cell.

A read operation is to find the intersection of the characteristic of a cell to be read from with a read line; FIG. 1 shows three viable read lines RD1, RD2, RD3.

It will be apparent from FIG. 1 that for an "easy" reading, i.e. with but a slight chance of confusing between levels, the latter should be spaced well apart. FIG. 1 illustrates a typical situation where the supply voltage VCC is low, e.g. 2.2 volts. It should be understood that it is not necessary for the level spacings to be uniform as shown in FIG. 1; on the contrary, the spacings can be optimized as most appropriate for reading.

All three of the read lines RD1, RD2, RD3 require that a cell be supplied a higher voltage VGS than the supply voltage VCC. In addition, the lines RD2 and RD3 require that the value of the voltage VGS be controlled according to the current ID flowing between the drain and source terminals of the cell being read from; such lines should be positioned so that cells associated with different levels can be readily differentiated from one another.

An easily implemented read line is the line RD1, which corresponds to the normal read mode previously described. The read voltage VL should be at least higher than the level L2—the last-but-one from the bottom—for otherwise the levels L2 and L3 cannot be differentiated according to the current ID. Having a higher voltage VL than the level L3 would be of little use, and could entail two disadvantages: on the one side, it becomes necessary to discriminate among four different values of the current ID, and on the other, when moving closer to the top, there would be a risk of confusing the levels, in particular L0 and L1, due to their diverging characteristics.

Figure 3:
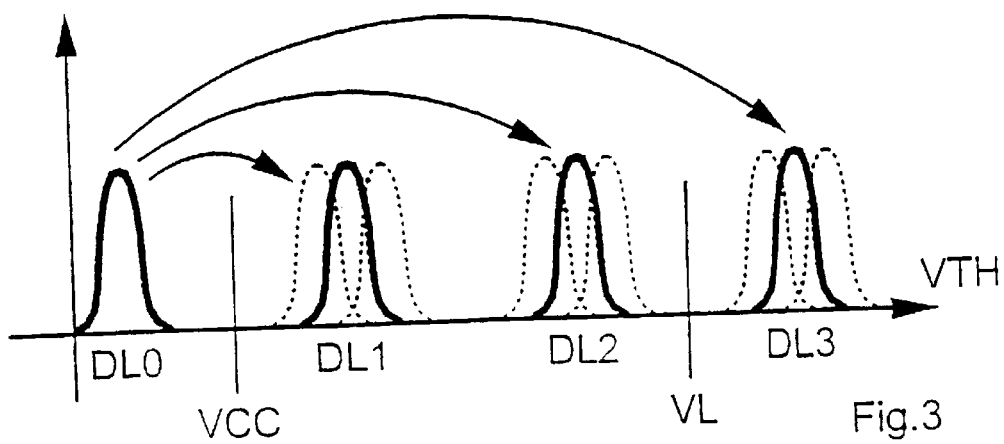
FIG. 3 shows distributions of cell threshold voltages vs. associated levels.

FIG. 3 illustrates the effect of the write method on the threshold voltage distributions. Seeing that if a set of cells having a given distribution are subjected to precisely the same electrical "treatment", the distribution remains near-constant and shifts in voltage, an uncertainty about the extent of the shift will depend substantially on the write method. By using a fairly simple method, the effect from an initial level L0 can be that shown in FIG. 3 for different end levels L1, L2, L3.

The divergence problem in connection with a simple read method—read line RD1—and a simple write method, restricts the number of the levels, and the more so where CMOS technologies are used in which the usable voltages tend to be limited, e.g. in the range of 12 to 15 volts.

The multi-level memory circuit of this invention comprises:

a) a plurality of memory cells, each adapted to store more than one item of binary information and comprised of at least one floating gate MOS transistor, the information stored in each cell corresponding to the level of the cell threshold voltage; and b) a write signal generating circuit for the cell plurality, adapted to be input a supply voltage.

The write signals are electrically the same for all the cells, for a given information to be stored, they having widths of regulated value. Thus, for example, if each cell is to store an item of binary information corresponding to two bits, four different write signals would be needed, in theory. Actually, since non-volatile memories cannot be reprogrammed, three discrete write signals can suffice because the fourth level is obtained by erasing.

Such a memory circuit may require that the generating circuit be adapted to generate internally a write voltage having a value selectable from a number, three in this example, of discrete regulated values corresponding to the number, four in this example, of the discrete levels provided.

Alternatively, the generating circuit could generate internally a number, three in this example, of write voltages having discrete regulated values corresponding to the number, four in this example, of the discrete levels provided. This alternative would be of advantage where several memory cells, possibly in separate arrays, must be programmed simultaneously.

One way of generating regulated voltages is to use a linear type of voltage regulating circuit provided with a reference circuit for generating a stable reference voltage. Where more than one discrete write voltages are to be generated, a number of regulating circuits would be required.

In view of that, to generate a plurality of discrete regulated voltages, in a linear regulator, a corresponding plurality of discrete reference voltages are required, the regulator circuit may be advantageously arranged to include a voltage divider connected to the output of the reference circuit and having a plurality of center taps to provide a corresponding plurality of reference voltages. In this way, the reference voltages will be stable as well as tied to one another in stable ratii, determinable with great accuracy. The reference voltages so generated can be coupled selectively to a single regulator by means of controlled switches, or be coupled to discrete regulators.

To avoid read errors due to shifting inaccuracy, it is advantageous if the level spacings are large. This can be accomplished by raising the voltage internally, where no external voltage source is available with a sufficiently high value. In this case, the generating circuit may include a voltage boosting circuit, adapted to output a write voltage exceeding the value of the supply voltage, and at least one voltage regulating circuit connected to the boosting circuit output. This requirement is specially stringent where the circuit is input no program voltage usually denoted by the reference VPP.

With the levels well spaced apart, the write operation becomes less critical. The generating circuit may then be designed to generate a single write voltage pulse, for each write operation into a cell, whose amplitude corresponds to one of the regulated discrete write voltage values, specifically that associated with the information to be stored. In this case, it is convenient if the generating circuit can also regulate the pulse duration accurately; in this way, the write signals would be electrically identical for the various cells.

When simple read/write methods are chosen, the ideal number of discrete levels is four.

The present circuit is applicable in particular to either EPROMs or OTP (One Time Programmable) memories (OTP memories being basically non-erasable EPROMs in that they lack a UV radiation transparent window), because the uncertitude in the distribution shift would be there only once. In fact, reprogramming is impossible, and erasing is either impossible or effected by a separate physical process. In this case, the number of levels can be raised to sixteen at an error rate which is still acceptable.

The inventive memory circuit just described can be included in a semiconductor integrated electronic storage device or a generic semiconductor integrated electronic device in combination with at least one logic circuit connected to the memory circuit for reading and/or writing information.

An EPROM semiconductor integrated electronic storage device will now be described by way of example with the aid of FIGS. 2, 4 and 5.

Figure 2:
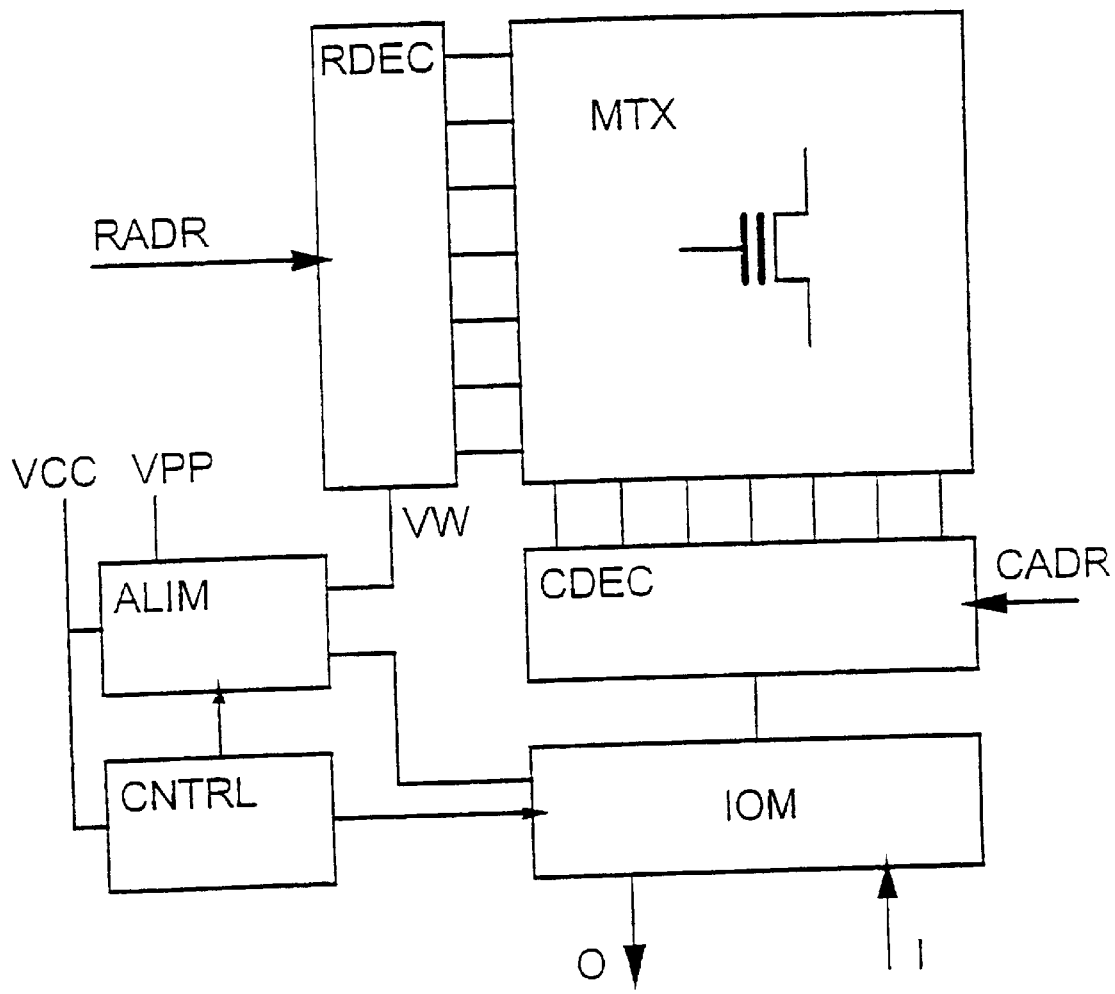
FIG. 2 illustrates the architectures of a conventional electronic storage device and one according to the invention.

The architecture of FIG. 2 comprises a matrix MTX of memory cells organized into rows and columns. Connected thereto are a row decoder RDEC and a column decoder CDEC, which are input row RADR and column CADR addresses. The decoder CDEC is connected to an input/output managing circuit IOM which performs physically the read/write operations from/into the cells according to input signals I thereto and output signals O therefrom.

The circuits in the architecture of FIG. 2 need to be powered, which is accomplished by means of a power supply circuit ALIM receiving an external supply voltage VCC and external program voltage VPP. In general, EPROMs are only supplied the voltage VPP during the off-line programming phase. In particular, the circuit ALIM supplies the decoder RDEC with a voltage VW for the word line which may be regarded as the read voltage during read operations, and the write voltage during write operations.

The storage devices further require, and do include, a control circuit CNTRL which is supplied the voltage VCC to control the operation of the various internal circuits according to input control signals, not shown in FIG. 2.

Figure 4:
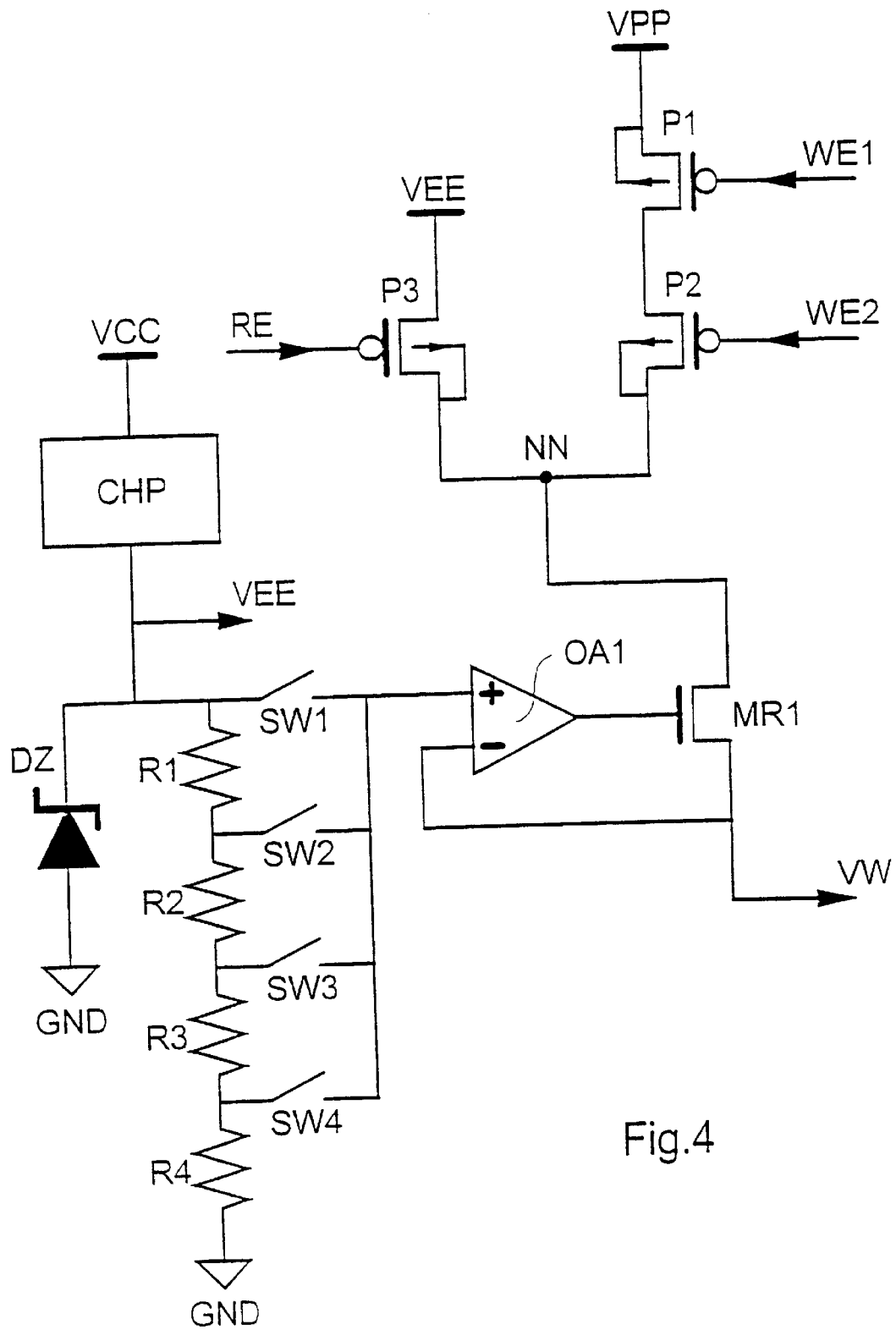
FIGS. 4 and 5 show first and second circuit diagrams for part of a generating circuit according to the invention.
Figure 5:
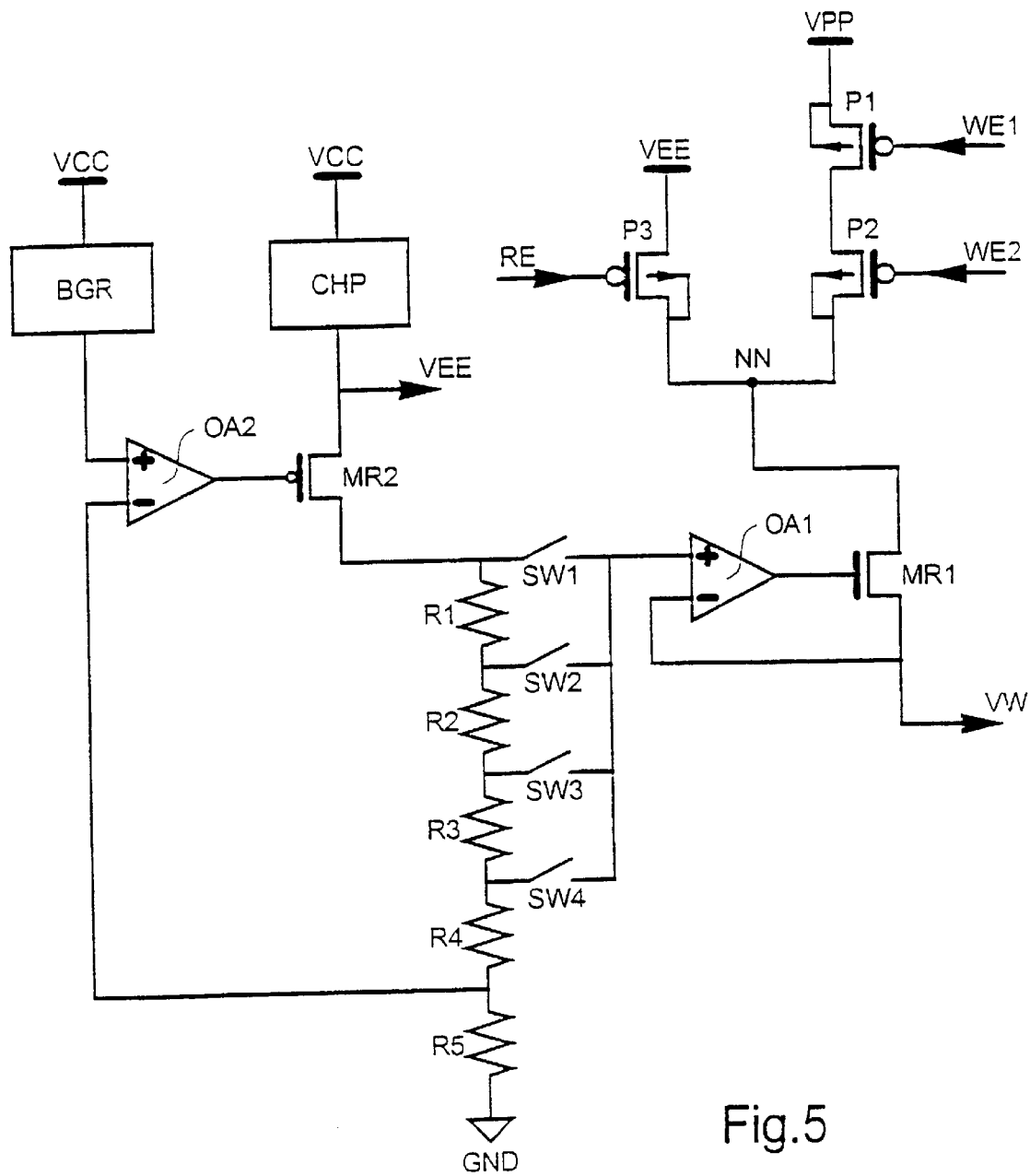

The circuits shown in FIGS. 4 and 5 illustrate two alternatives for a portion of the circuit ALIM which is utilized to generate the read or write voltage VW, as the case may be.

The circuit of FIG. 4 comprises three P-channel MOS transistors P1, P2, P3 acting as controlled switches. The first two, P1 and P2, have their main conduction paths connected in series between a node to be connected to a program voltage reference VPP and an internal node NN. The transistor P3 has its main conduction path connected between a node to be connected to a boosted voltage reference VEE and the internal node NN. The transistors P1 and P2 are input, to their control terminals, two write enable signals WE1 and WE2, respectively, which are synchronous with each other. The transistor P3 is input, to its control terminal, a read enable signal RE. The two transistors in series in the write leg serve to prevent spurious current flows between the references VEE and VPP.

The circuit of FIG. 4 further includes a conventional charge pump circuit CHP being input a supply voltage VCC and outputting the boosted voltage VEE. In general, such charge pump circuits include regulating arrangements to prevent the output voltage from overtaking predetermined limits. The output of the circuit CHP is connected to a first terminal of a zener diode DZ acting as a reference voltage generating circuit; the other terminal of the diode DZ is connected to ground, GND.

The output of the circuit CHP is connected to a first end terminal of a voltage divider comprised of four resistors R1, R2, R3, R4 connected serially together, the second end terminal being connected to ground at GND.

The center taps and first end terminal of the divider are connected to the non-inverting input of an operational amplifier OA1 via four controlled switches SW1, SW2, SW3, SW4, respectively. In one embodiment, the voltage at the first end terminal, and therefore, the zener voltage, is 12 volts, and the voltages at the center taps are 10, 8 and 7 volts, respectively. The 7-volt voltage is used for reading, and the other three for programming three different levels of the threshold voltage. The fourth level is provided by the erasing through exposure to UV radiation.

The amplifier OA1 and a transistor MR1 form the essentials of a voltage regulator of the linear type. The gate terminal of the regulation transistor MR1 is controlled by the output from the amplifier OA1. The source terminal of the transistor MR1 is connected to the inverting input of the amplifier OA1, and its drain terminal is connected to the node NN. The output of the linear regulator is the source terminal of the transistor MR1.

The circuit of FIG. 5 is basically identical with the circuit of FIG. 4, except that its reference circuit is different and comprises a conventional band-gap circuit BGR being supplied the voltage VCC. This circuit can output a truly stable voltage, typically of 2 volts.

The output of the circuit BGR is connected to the non-inverting input of another operational amplifier OA2. The output of the amplifier OA2 is connected to the gate terminal of another regulation transistor MR2. The main conduction path of the transistor MR2 is interposed between the output of the circuit CHP and the divider input, i.e. the first end terminal thereof. The divider of FIG. 5 has four center taps, because one of these, presenting a corresponding voltage to that from the circuit BGR, is to be connected to the inverting input of the amplifier OA2.

The operation of the circuits shown in FIGS. 4 and 5 is substantially the same.

The transistors P1, P2, P3 function to select the supply source from VPP or VEE, while preventing spurious current flows from occurring between the two sources.

The transistor MR1, in cooperation with the amplifier OA1, sets the voltage VW to the voltage value present at the amplifier non-inverting terminal, i.e. the voltage value of the tap selected by means of the switches SW1, . . . , SW4.

The voltage at the divider input corresponds to the voltage from the circuit CHP as stabilized by a suitable stabilizing circuit comprised of the zener diode DZ of FIG. 4, the band-gap circuit BGR jointly with the amplifier OA2, and the transistor MR2 of FIG. 5.

What is claimed is:

1. A multi-level memory circuit comprising:
   a plurality of memory cells, each for storing more than one item of binary information and comprising at least one floating gate MOS transistor, the information stored in each cell corresponding to a threshold voltage level thereof; and
   a write signal generating circuit for said plurality of memory cells and having an input connected to a supply voltage, said write signal generating circuit generating internally a write signal voltage having a selectable value from a number of regulated discrete spaced apart voltage values corresponding to a number of discrete spaced apart threshold voltage levels wherein said write signal generating circuit comprises at least one linear voltage regulating circuit including a reference circuit for generating a stable reference voltage.

2. A multi-level memory circuit according to claim 1, wherein said regulating circuit includes a voltage divider connected to the output of said reference circuit and having a plurality of taps for providing a corresponding plurality of discrete spaced apart reference voltages.

3. A multi-level memory circuit according to claim 1, wherein said write signal generating circuit comprises:
   a voltage booster circuit for generating a higher voltage output than the supply voltage; and
   at least one voltage regulating circuit connected to the output of said booster circuit.

4. A multi-level memory circuit according to claim 1, wherein said write signal generating circuit generates a single write signal voltage pulse for each write operation into a cell, an amplitude of the single write signal voltage pulse corresponding to a write signal voltage value associated with information to be stored.

5. A multi-level memory circuit according to claim 4, wherein said write signal generating circuit also controls a duration of the single write signal voltage pulse.

6. A multi-level memory circuit according to claim 1, wherein the discrete spaced apart threshold voltage levels are four in number.

7. A multi-level memory circuit according to claim 1, wherein each of said plurality of memory cells is an EPROM cell.

8. A multi-level memory circuit according to claim 1, wherein each of said plurality of memory cells is an OTP cell.

9. A multi-level memory circuit comprising:
   a plurality of memory cells, each for storing more than one item of binary information and comprising at least one floating gate MOS transistor, the information stored in each cell corresponding to a threshold voltage level thereof; and
   a write signal generating circuit for said plurality of memory cells generating internally a number of regulated discrete spaced apart write signal voltages corresponding to a number of discrete spaced apart threshold voltage levels wherein said write signal generating circuit comprises at least one linear voltage regulating circuit including a reference circuit for generating a stable reference voltage.

10. A multi-level memory circuit according to claim 9, wherein said write signal generating circuit has an input connected to a supply voltage, and wherein at least one of the regulated discrete spaced apart write signal voltages is greater than the supply voltage.

11. A multi-level memory circuit according to claim 9, wherein said regulating circuit includes a voltage divider connected to the output of said reference circuit and having a plurality of taps for providing a corresponding plurality of discrete spaced apart reference voltages.

12. A multi-level memory circuit according to claim 9, wherein said write signal generating circuit comprises:
   a voltage booster circuit for generating a higher voltage output than the supply voltage; and at least one voltage regulating circuit connected to the output of said booster circuit.

13. A multi-level memory circuit according to claim 9, wherein said write signal generating circuit generates a single write signal voltage pulse for each write operation into a cell, an amplitude of the single write signal voltage pulse corresponding to a write signal voltage value associated with information to be stored.

14. A multi-level memory circuit according to claim 13, wherein said write signal generating circuit also controls a duration of the single write signal voltage pulse.

15. A multi-level memory circuit according to claim 9, wherein the discrete spaced apart threshold voltage levels are four in number.

16. A multi-level memory circuit according to claim 9, wherein each of said plurality of memory cells is an EPROM cell.

17. A multi-level memory circuit according to claim 9, wherein each of said plurality of memory cells is an OTP cell.

18. A semiconductor integrated electronic storage device comprising:
   at least one memory circuit comprising
      a plurality of memory cells, each for storing more than one item of binary information and comprising at least one floating gate MOS transistor, the information stored in each cell corresponding to a threshold voltage level thereof, and
      a write signal generating circuit for said plurality of memory cells generating internally a number of regulated discrete spaced apart write voltages corresponding to a number of discrete spaced apart threshold voltage levels wherein said write signal generating circuit comprises at least one linear voltage regulating circuit including a reference circuit for generating a stable reference voltage.

19. A semiconductor integrated electronic storage device according to claim 18, wherein said write signal generating circuit has an input connected to a supply voltage, and wherein at least one of the regulated discrete spaced apart write signal voltages is greater than the supply voltage.

20. A semiconductor integrated electronic storage device according to claim 18, wherein said regulating circuit includes a voltage divider connected to the output of said reference circuit and having a plurality of taps for providing a corresponding plurality of discrete spaced apart reference voltages.

21. A semiconductor integrated electronic storage device according to claim 18, wherein said write signal generating circuit comprises:
   a voltage booster circuit for generating a higher voltage output than the supply voltage; and
   at least one voltage regulating circuit connected to the output of said booster circuit.

22. A semiconductor integrated electronic storage device according to claim 18, wherein said write signal generating circuit generates a single write signal voltage pulse for each write operation into a cell, an amplitude of the single write signal voltage pulse corresponding to a write signal voltage value associated with information to be stored.

23. A semiconductor integrated electronic storage device according to claim 22, wherein said write signal generating circuit also controls a duration of the single write signal voltage pulse.

24. A semiconductor integrated electronic storage device according to claim 18, wherein the discrete spaced apart threshold voltage levels are four in number.

25. A semiconductor integrated electronic storage device according to claim 18, wherein each of said plurality of memory cells is an EPROM cell.

26. A semiconductor integrated electronic storage device according to claim 18, wherein each of said plurality of memory cells is an OTP cell.

27. A semiconductor integrated electronic storage device according to claim 18 further comprising at least one logic circuit connected to the at least one memory circuit for one of reading and writing information.

\* \* \* \* \*

UNITED STATES PATENT AND TRADEMARK OFFICE
CERTIFICATE OF CORRECTION

PATENT NO. : 6,097,628
DATED : August 1, 2000
INVENTOR(S) : Paolo Rolandi

It is certified that error appears in the above-identified patent and that said Letters Patent is hereby corrected as shown below:

Column 1, Line 15    Delete: "own"

Column 1, Line 26    Delete: "power ed"
                     Insert -- powered --

Column 2, Line 15    Delete: "tour"
                     Insert -- four --

Signed and Sealed this

Seventeenth Day of April, 2001

Attest:

NICHOLAS P. GODICI

*Attesting Officer*    Acting Director of the United States Patent and Trademark Office